US012562743B2

(12) United States Patent
Savidis et al.

(10) Patent No.: US 12,562,743 B2
(45) Date of Patent: Feb. 24, 2026

(54) RECONFIGURABLE ARRAY FOR ANALOG APPLICATIONS

(71) Applicant: Drexel University, Philadelphia, PA (US)

(72) Inventors: Ioannis Savidis, Wallingford, PA (US); Ziyi Chen, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 202 days.

(21) Appl. No.: 18/184,692

(22) Filed: Mar. 16, 2023

(65) Prior Publication Data

US 2023/0344431 A1      Oct. 26, 2023

Related U.S. Application Data

(60) Provisional application No. 63/333,664, filed on Apr. 22, 2022.

(51) Int. Cl.
H03K 19/17704 (2020.01)
H03K 19/17732 (2020.01)
H03K 19/17736 (2020.01)

(52) U.S. Cl.
CPC . H03K 19/17712 (2013.01); H03K 19/17732 (2013.01); H03K 19/1774 (2013.01)

(58) Field of Classification Search
None
See application file for complete search history.

(56) References Cited

U.S. PATENT DOCUMENTS

| | | | | |
|---|---|---|---|---|
| 8,111,097 B1 * | 2/2012 | Kutz | H03K 25/04 | |
| | | | | 330/86 |
| 2006/0261846 A1 * | 11/2006 | Twigg | H03K 19/173 | |
| | | | | 326/37 |
| 2010/0301897 A1 * | 12/2010 | Heaton | H03K 19/17704 | |
| | | | | 326/38 |

OTHER PUBLICATIONS

Chen et al., "Reconfigurable Array for Analog Applications", IEEE Xplore, 39th International Conference on Computer Design, Dec. 2021, 8 pages.
Chen et al. "Reconfigurable Analog Array for Hardware Security", IEEE, International Symposium on Circuits and Systems, Nov. 11, 2022, 5 pages.

* cited by examiner

*Primary Examiner* — Anh Q Tran
(74) *Attorney, Agent, or Firm* — Schott, P.C.

(57) ABSTRACT

A field-programmable analog array (FPAA) fabric includes a 6×6 matrix of configurable analog blocks (CABs). The implementation of programmable CABs eliminates the use of fixed analog subcircuits. A unique routing strategy is developed within the CAB units that supports both differential and single-ended mode circuit configurations. The bandwidth limitation due to the routing switches of each individual CAB unit is compensated for through the use of a switch-less routing network between CABs. Algorithms and methodologies facilitate rapid implementation of analog circuits on the FPAA. The proposed FPAA fabric provides high operating speeds as compared to existing FPAA topologies, while providing greater configuration in the CAB units as compared to switch-less FPAA. The FPAA core includes 498 programming switches and 14 global switchless interconnects, while occupying an area of 0.1 mm2 in a 65 nm CMOS process.

18 Claims, 14 Drawing Sheets

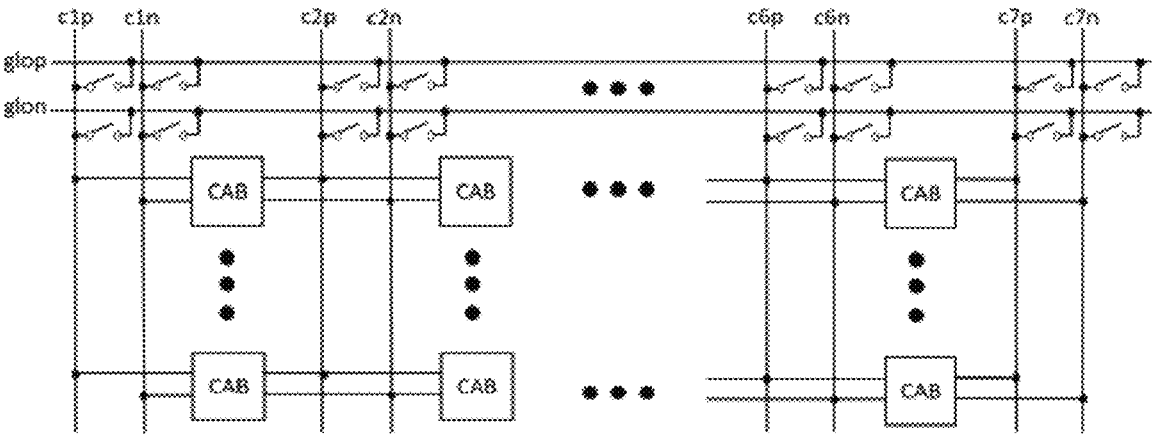
FIG. 5
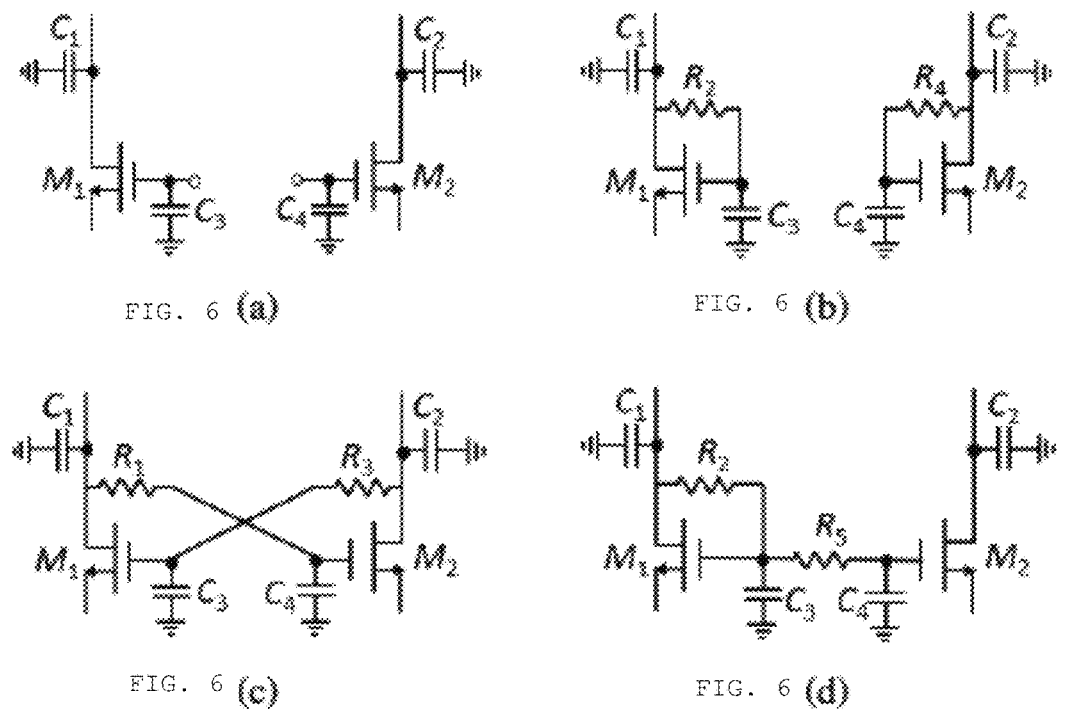
FIG. 6 (a)          FIG. 6 (b)
FIG. 6 (c)          FIG. 6 (d)

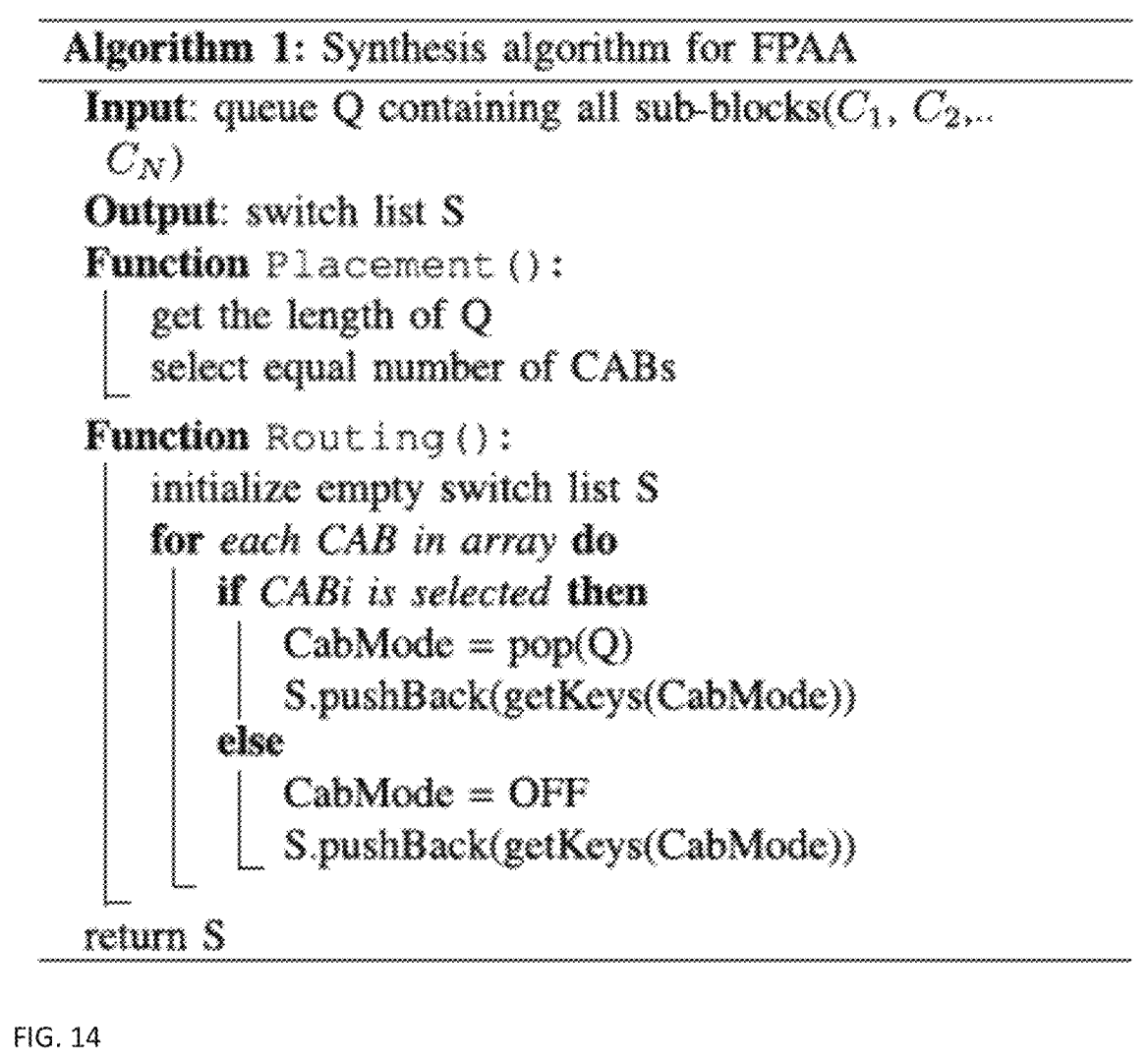

Algorithm 1: Synthesis algorithm for FPAA

Input: queue Q containing all sub-blocks($C_1$, $C_2$,...
$C_N$)

Output: switch list S

Function Placement ():

get the length of Q select equal number of CABs

Function Routing ():

initialize empty switch list S for *each CAB in array* do if *CABi is selected* then

CabMode = pop(Q)

S.pushBack(getKeys(CabMode))

else

CabMode = OFF

S.pushBack(getKeys(CabMode))

return S

FIG. 14

TABLE I

CONFIGURATION MODE OF CAB1 TO IMPLEMENT AN OP AMP, DYNAMIC LATCH, AND CS AMPLIFIER

| CAB Type | | Configuration Mode | S1 | S2 | S3 | S4 | S5 | S6 | S7 | S8 | S9 | S10 | S11 | S12 | S13 | S14 | S15 | S16 | S17 | S18 |
|---|---|---|---|---|---|---|---|---|---|---|---|---|---|---|---|---|---|---|---|---|
| CAB1 | Op-Amp | Current Mirror Load | OFF | OFF | OFF | OFF | OFF | OFF | ON | OFF | OFF | ON | OFF | OFF | OFF | ' | ' | ' | ' | ' |
| | | Current Source Load | OFF | OFF | OFF | OFF | OFF | OFF | ON | OFF | OFF | ON | ON | OFF | OFF | ' | ' | ' | ' | ' |
| | | Current Source Load CMFB | OFF | OFF | OFF | OFF | OFF | OFF | ON | ON | ON | OFF | OFF | OFF | OFF | ' | ' | ' | ' | ' |
| | | Diode-connected Load | OFF | OFF | OFF | OFF | OFF | ON | OFF | ON | OFF | OFF | OFF | OFF | OFF | ' | ' | ' | ' | ' |
| | | Dynamic Latch | OFF | OFF | ON | OFF | OFF | ON | OFF | OFF | ON | OFF | OFF | OFF | OFF | ' | ' | ' | ' | ' |
| CAB2 | CS-Amp | PMOS Current Source Load | OFF | OFF | OFF | OFF | OFF | OFF | ON | OFF | OFF | OFF | ON | OFF | OFF | OFF | OFF | ON | OFF | OFF |
| | | PMOS Diode-connected Load | OFF | OFF | OFF | OFF | OFF | OFF | ON | OFF | OFF | OFF | ON | OFF | OFF | OFF | ON | OFF | OFF | OFF |
| | | NMOS Current Source load | OFF | OFF | OFF | OFF | OFF | OFF | ON | OFF | OFF | OFF | ON | OFF | OFF | OFF | ON | OFF | ON | ON |

FIG. 15

TABLE II

3-DB BANDWIDTH COMPARISON OF BASELINE AND RECONFIGURABLE AMPLIFIERS

| Implementation | | 3-dB Bandwidth of | |
|---|---|---|---|
| | | Reconfigured | Baseline |
| Op-Amp | Current Mirror Load | 887 MHz | 3.2 GHz |
| | Current Source Load | 958 MHz | 4.8 GHz |
| | Current Source Load CMFB | 1.39 GHz | 4.7 GHz |

FIG. 16

TABLE III
COMPARISON WITH PRIOR WORK

| | Technology | Architecture | Operating Freq. | Area | Num. of CABs | Application | CAD |
|---|---|---|---|---|---|---|---|
| [3] | 130 nm | Switch-less | 82 MHz | $1\ mm^2$ | 7 | Filter | - |
| [6] | 350 nm | FG-based | 57 MHz | $9\ mm^2$ | 32 | Receiver / Speech Processor | Simulink |
| [7] | 90 nm | Switch-less | 500 Hz | - | 27 | Filter | - |
| [5] | 350 nm | FG-based | 18 MHz | $84\ mm^2$ | 108 | Analog-to-digital Conversion | Verilog / Matlab |
| [3] | 2 μm | Switch-based | 10 MHz | $626\ \mu m \times 750\ \mu m$ | 40 | Analog Arithmetic Operations / Filter | - |
| [8] | 350 nm | Switch-based | 20 MHz | $0.9\ mm^2$ | 25 | Translinear Computing | - |
| [9] | 350 nm | FG-based | 200 KHz | $9\ mm^2$ | 18 | Translinear Computing | Verilog / Matlab |
| This Work | 65 nm | hybrid | 1.5 GHz | $0.1\ mm^2$ | 36 | Filter / Oscillator / Divider | Python / Ocean |

FIG. 17

RECONFIGURABLE ARRAY FOR ANALOG APPLICATIONS

STATEMENT REGARDING GOVERNMENT SUPPORT

This invention was made with government support under Contract No, CNS-1751032 awarded by the National Science Foundation. The government has certain rights in the invention.

BACKGROUND

Due to the long design time and the high cost of fabrication for full customized integrated circuits (ICs); the rapid development of an IC at low cost appeals to many IC manufacturers and investigators. One solution that provides rapid and low-cost IC development is through implementation on a programmable fabric. The field programmable gate array (FPGA) is well developed and is applied extensively in both commercial products and research. However, minimum effort has been applied to the development of the analog counterpart to FPGA; field programmable analog array (FPAA). The FPAA has drawn greater attention in recent years. While the FPGA utilizes gate arrays and look-up tables (LUT) to implement logical functions, analog circuit blocks are difficult to generalize into a uniform architecture. Existing FPAA fabrics generally target for a specific application including a Gm-C filter [1] proposed, a vector-matrix multiplication (VMM) [2] described, and a switch-capacitor filtering [3] developed, where the implementation of the circuitry based on fixed analog structure.

The centerpiece of the FPAA is the configurable analog block (CAB). However the elements within each CAB vary depending on the target application and the given specifications. Generally, each individual CAB contains multiple coarse-grain analog blocks, routing switches, and passive devices in order to provide programmability and tunability. CAB targeted for a filter application includes multiple Gm cells connected in parallel to provide control of the transconductance.

In order to provide connectivity between different CABs and increase the configurability of the CAB array, both switch-based and switch-less routing approaches are utilized. While the switch-based routing network provides the highest degree of programmability, the routing switches on the signal path introduce massive bandwidth limitations. The switch-less routing strategy, however, reduces the effect on bandwidth due to the routing switches but at a cost of less programmability due to the fixed interconnect.

SUMMARY OF THE EMBODIMENTS

A field-programmable analog array (FPAA) fabric includes a 6×6 matrix of configurable analog blocks (CABs). The implementation of programmable CABs eliminates the use of fixed analog subcircuits. A unique routing strategy is developed within the CAB units that supports both differential and single-ended mode circuit configurations. The bandwidth limitation due to the routing switches of each individual CAB unit is compensated for through the use of a switch-less routing network between CABs. Algorithms and methodologies facilitate rapid implementation of analog circuits on the FPAA. The proposed FPAA fabric provides high operating speeds as compared to existing FPAA topologies, while providing greater configuration in the CAB units as compared to switch-less FPAA. The FPAA core includes 498 programming switches and 14 global switchless interconnects, while occupying an area of 0.1 mm2 in a 65 nm CMOS process.

The characteristic power consumption is approximately 24.6 mW for a supply voltage of 1.2 V. Circuits implemented on the proposed FPAA fabric include operational amplifiers (op amps), filters, oscillators, and frequency dividers. The reconfigured bandpass filter provides a center frequency of approximately 1.5 GHz, while the synthesized ring-oscillator and frequency divider support operating frequencies of up to 500 MHz.

BRIEF DESCRIPTION OF THE DRAWINGS

The figures supplement the below description.

FIG. 5. shows a schematic of global feedback network. The feedback network consists of 2×28 switches, which support multi-CAB level feedback throughout all six columns of CAB matrix.

FIGS. 6(a)-6(d) show a parasitic model of four configurations of a NMOS transistor pair that include: 6(a) differential input pair, 6(b) diode-connected pair, 6(c) regeneration loop pair, and 6(d) current mirror pair.

FIG. 12(a) shows the frequency divider can reconfigured with two CABs, both CABs are programmed into differential dynamic latch. FIG. 12(b) shows the circuit detail of differential dynamic latch.

FIG. 14 shows Algorithm 1.

FIG. 15 shows Table 1.

FIG. 16 shows Table 2.

FIG. 17 shows Table 3.

DETAILED DESCRIPTION OF THE EMBODIMENTS

1 Reconfigurable Array for Analog Applications

1.1 Introduction

An FPAA CAB is proposed that is fully programmable with no prior functionality before programming. In addition, routing switches between different CABs are eliminated to address the bandwidth limitation of the overall system. The proposed FPAA is used to implement an op amp, continuous-time filter, ring-oscillator, and frequency divider.

1.2 Architecture of FPAA

Figure 1:
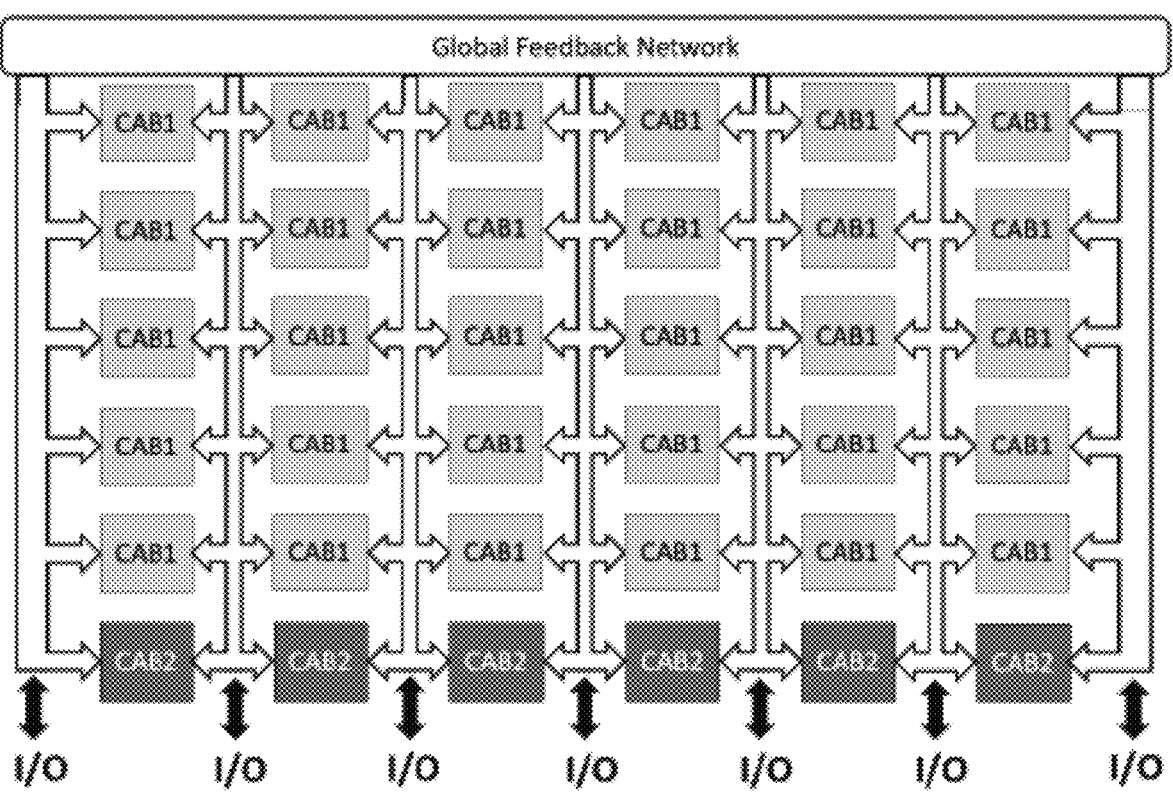
FIG. 1 shows the FPAA Architecture with its core organized into a 6×6 CAB matrix.

The proposed FPAA architecture is organized into a 6×6 CAB matrix as shown in FIG. 1, where each column of CABs is directly accessed through seven I/O ports, though different CAB matrixes are possible. There are two different topologies of CABs within the array to facilitate both single-ended and differential mode operation. A global routing network allows positive or negative feedback across multiple CABs to implement more complex analog topologies. In addition, the bandwidth limitation due to the routing switches is reduced by implementing switch-less interconnects between CABs.

1.2.1 CAB Architecture

Figure 2:
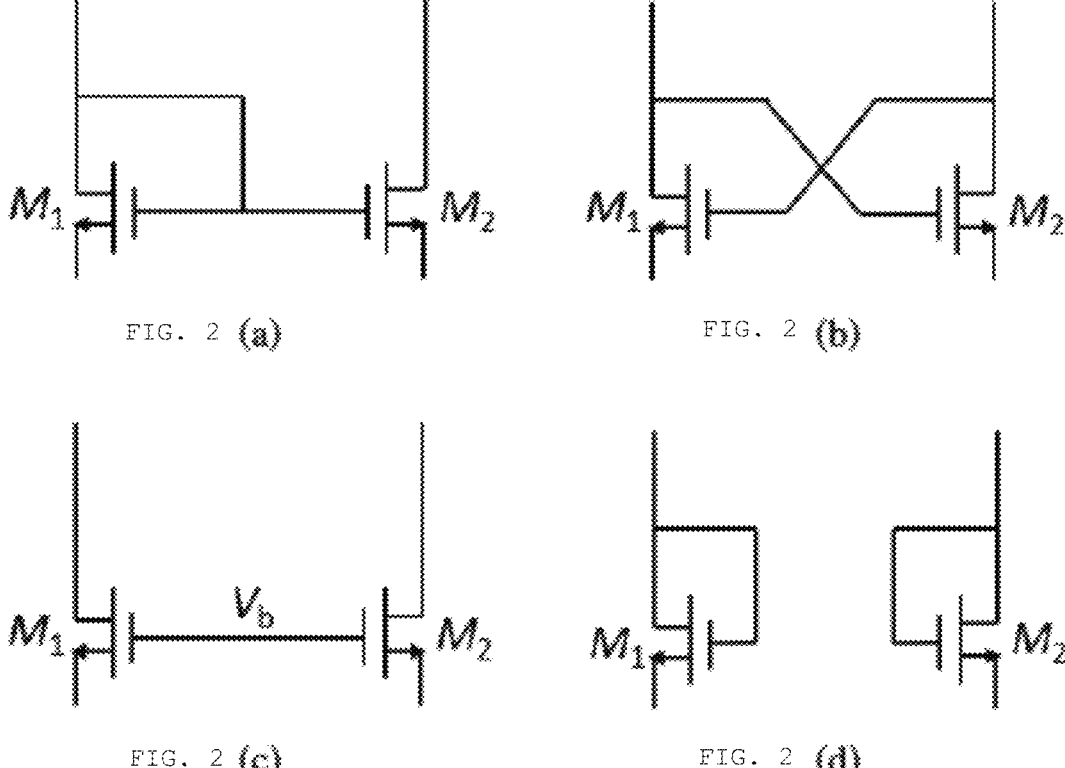
FIGS. 2(a)-(d) show possible topologies achieved with a single NMOS transistor pair. The same topologies are applicable to PMOS transistor pairs, include a 2(a) current mirror, 2(b) regeneration loop, 2(c) current source pair, and 2(d) diode-connected pair.
Figure 3:
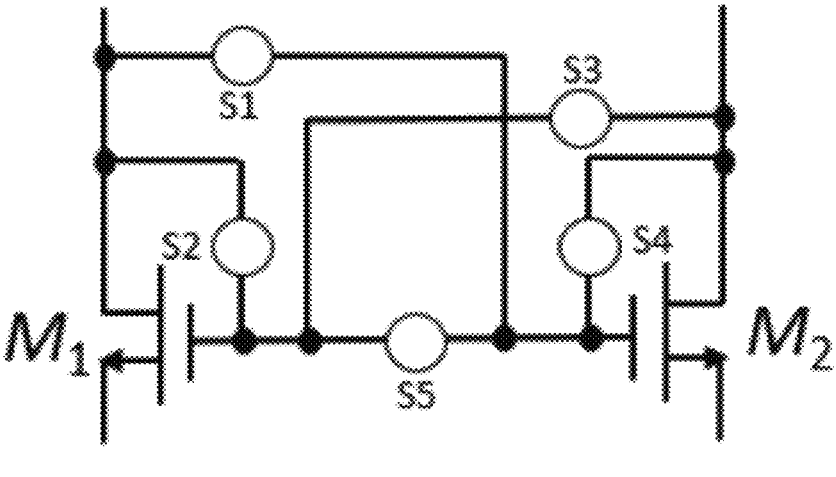
FIG. 3 shows a schematic of reconfigurable NMOS and PMOS pairs Each pair utilize five routing switches that are reconfigurable to form a current mirror, regeneration loop, current source pair, and diode-connected pair.
Figure 3:
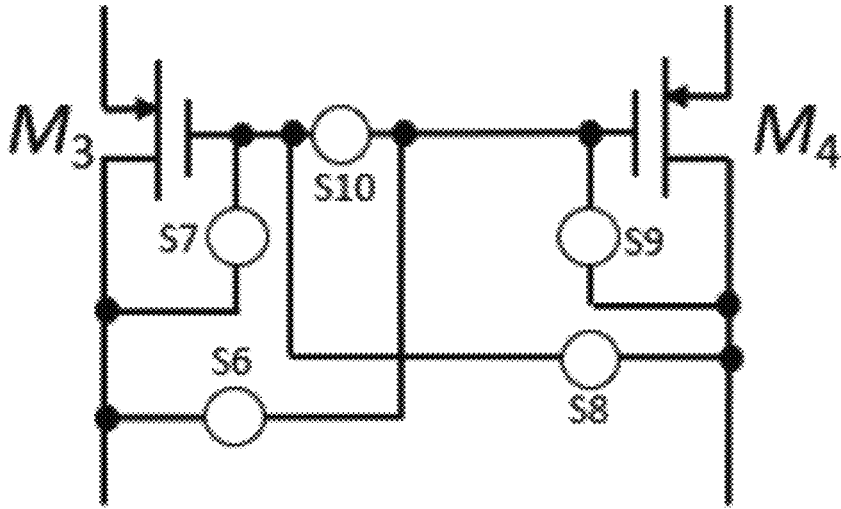

The CAB unit is the mid-level building block of the FPAA fabric, which may be reconfigured into different variants depending on the specifications of the implemented circuitry. As discussed herein, one solution explores the programmability of the CABs and achieving a maximum number of reconfigurable topologies with a minimum number of transistors and switches. As differential mode analog signal processing usually requires NMOS and PMOS pairs, there are four categories of topologies to consider as shown in FIGS. 2(a)-(d). To cover the four distinct configurations in a generic architecture, two reconfigurable transistor pairs as shown in FIG. 3 are proposed, where routing switches are added as controllable interconnects between the gate and drain terminals.

Based on the generic architecture of the NMOS and PMOS pair, two different topologies of CABs are developed to support both differential mode and single-ended mode operation. As shown in FIGS. 4(a) and 4(b), the first CAB topology utilizes the basic structure of a five transistors operational transconductance amplifier (OTA), which includes one NMOS differential pair, one PMOS active load pair, and one NMOS current source. In addition, 13 routing switches are included to allow for the full programmability of the CAB. The switches S1 to S5 are used to program NMOS differential pair, where S2 and S4 are utilized for negative feedback and S1 and S3 are used to provide positive feedback or form the regeneration loop. The switches S6 to S10 are used to program the PMOS differential pair, where S7 and S9 form diode-connected load, S6 and S8 implement the regeneration loop for the PMOS pair. The S11 switch is used to control the common mode feedback, while S12 and S13 are used to completely turn off the CAB by connecting the gate of the PMOS current source to VDD and NMOS current source to ground. Note that the CAB topology is undefined before programming, which therefore increases the flexibility of the proposed FPAA fabric. The first CAB is reconfigured into different types of op amps, including a differential pair with a current source load and a differential pair with a diode-connected load. The proposed CAB topology differs from prior CAB design methodologies, where the analog sub-circuit is usually fixed and the programmability is based on routing between predefined subblocks. The limitation on the configurability of the FPAA is addressed making the analog sub-blocks fully programmable.

1.2.2 Routing Wire

To eliminate routing switches between CABs and increase the peak bandwidth, a global switch-less routing technique may be implemented on the FPAA. The input and output terminals of CABs the in each column are tied together using a single global interconnects, one for the inputs and one for the outputs. To explicitly define the differential signal transition of the CABs, the switch-less networks are labeled to differentiate between the p-path (c #p) or n-path (c #n) as shown in FIG. 5. The positive terminal of each CAB is directly connected to the p-path only, and the negative terminal of each CAB is routed to n-path only. With precise polarity notation, the representation of a differential signal between CABs is easier to track.

1.2.3 Feedback Network

Feedback, positive and/or negative, is widely used in analog and RF circuits design. While negative feedback may be used to implement amplifiers with great accuracy, positive feedback is utilized with oscillators and dynamic latches. Although each CAB includes routing switches to configure either positive or negative feedback, feedback paths across multiple CABs is also provided to increase flexibility of the multi-CAB topology. To provide feedback between any two columns of CABs. A global feedback network structure as shown in FIG. 5 may be used. The global feedback networks include two parallel paths to support differential mode operation. Since the switchless interconnects include explicitly annotated polarity, negative feedback is provided by connecting a positively labeled output with a negatively labeled input and a negatively labeled output with a positively labeled input. Similarly, positive feedback is achieved by connecting inputs and outputs with the same polarity. Since each column of CABs is connected to the global feedback network, the positive or negative feedback between any two columns of CABs is easily implemented.

1.3 Reconfigured Circuit within CAB

This section describes the characterization of the distinct circuits that are configured using a single individual CAB. Analysis of the capability of differential mode CABs (CAB1) and single-ended mode CAB (CAB2) indicates greater configurability of the proposed CAB topology as compared to prior work.

1.3.1 Differential Mode CAB

The schematic of a differential mode CAB is shown in FIG. 4a. Using one NMOS pair, one PMOS pair, and one NMOS current source, the CAB1 topology is configurable into different types of op amps and OTA circuits. The reconfigurability of CAB1 is provided by the switches S1 to S11 while switches S12 and S13 are used to completely turn off CAB. To reconfigure the CAB and implement an op amp and a common-source amplifier, the ON/OFF states of all switches is listed in FIG. 15, Table I. In order to configure the CAB1 into desired topology, the structure of the PMOS transistors is set to one of the four commonly used topologies, which are current mirror, regeneration loop, current source load and diode-connected load. The configuration of the NMOS transistors follows a similar procedure. The feedback paths are then set by either turning on S2 and S4 to provide negative feedback or turning on S1 and S3 to provide positive feedback. In addition, the proposed CAB structure also includes a common-mode feedback to stabilize the DC operating points within the op amp, which is important in applications that require a Gm-C filter.

1.3.2 Single-ended Mode CAB

The single-ended circuits are added to support and augment the functionality of differential mode circuits. The schematic of single-ended mode CAB (CAB2) is shown in FIG. 4b. The single-ended CAB may be reconfigured to implement a common source amplifier, with the utilization of either the left or right path of the CAB. The supported architectures include a common source amplifier with current source load or diode connected load. The current source configuration is implemented as a high swing second stage in a two-stage op amp. The configuration of the single-ended CAB topology using left-swing transistors and switches is listed in FIG. 15, Table I. The single-ended circuits using CAB2 are implemented on the last row of the CAB matrix.

1.4 Performance Degradation

This section describes the performance degradation that is introduced from the routing switches within the CAB. The switches allow for fine configuration of each CAB, which provides greater reconfigurability of the FPAA as compared to the fixed circuit topology. However routing switches add parasitic impedances to internal nodes, which degrade the performance. The parasitic capacitance of the global switchless interconnects is also characterized with spice simulation of the extracted view of FPAA core. Finally, a comparison of performance between the baseline design and reconfigured design of op amp is performed.

1.4.1 Parasitic Capacitance Due to Routing Switches

The NMOS pairs shown in FIG. 3 include at least five routing switches, which add extra parasitic capacitance on the internal nodes and limit the maximum achieved bandwidth. To address the impact of the routing switches, a generic NMOS pair is configured into four different cases as shown in FIGS. 6(a)-(d). Applying the switch annotation shown in FIG. 3, the capacitance C1 and C2 shown in FIGS. 6(a)-(6) represents the aggregate parasitic capacitance from switches S1, S2 and S3, S4, respectively. Capacitance C3 and C4 represent the parasitic capacitance from switches S2, S3, S5 and S1, S4, S5, respectively. The resistance R1 to R5 represent the on resistance of the corresponding switches. Due to parasitic switch impedances, the minimum time required to charge or discharge an internal node is longer. The switches provide 150Ω of on resistance with a W/L ratio of 10 μm/130 nm. The extracted parasitic impedances from the physical layout resulted in 38 fF of capacitance for C1 and C2, and approximately 41 fF of capacitance for C3 and C4.

1.4.2 Performance Comparison between Baseline Design and Reconfigured Design

To characterize the overall performance of the FPAA fabric, the CAB performance is first analyzed individually. Specifically, an individual CAB is programmed to implement different analog circuits and each compares against with a baseline design. The schemtaic of a differential mode CAB is shown in FIG. 4a, with a (W/L)1.2 ratio of 80

μm/130 nm and a (W/L) 3.4 ratio of 98 μm/130 nm. The comparison of the 3-dB bandwidth between reconfigured implementation of an amplifier and a baseline design is provided through the results listed in FIG. 16, Table II. The simulation results indicate maximum drop in the 3-dB bandwidth of around 3.84 GHz and minimum drop of around 2.3 GHz for the different amplifier topologies. The bandwidth for all configurations is greater than 0.8 GHz, although there is a significant drop in the 3-dB bandwidth compared to the corresponding baseline topology.

A similar comparison is performed on the single-ended CAB. Based on the CAB structure shown in FIG. 4b, an analysis of the performance of a single-ended CAB is completed. The AC simulation of the single-ended CAB indicates the 3 dB bandwidth of a reconfigured common source amplifier of 3.17 GHz while the 3-dB bandwidth of the baseline design is 27.5 GHz. The significant reduction in the bandwidth is due to the additional routing switches placed on the input terminal of the single-ended CAB. To completely turn off the single-ended CAB, the gate voltage of the NMOS transistors M1 and M2 must be pulled down to ground while the gate voltage of the PMOS transistor M3 and M4 must be pulled up to VDD. Due to the requirement of being able to turn off the CAB, additional switches are added to isolate the gate voltage and the global input network. Such a limitation does not arise for the differential mode CAB (CAB) as the bottom NMOS current source allows for the complete cut off the current path through all NMOS transistors.

1.5 Synthesis Methodology

This section describes an automated flow for FPAA synthesis and a CAB-oriented programming algorithm to rapidly implement analog circuits on the FPAA.

1.5.1 Software Interface

Figure 7:
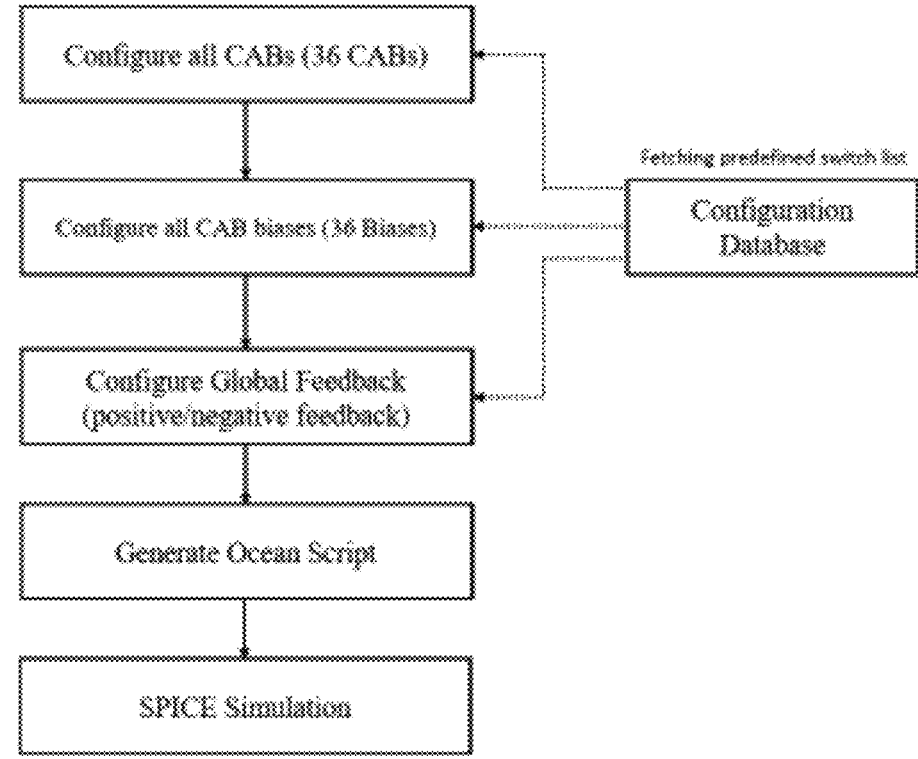
FIG. 7 shows design flow of implementing analog circuits on the FPAA. After determining the configuration of the CABs, the CAB biases, and the global feedback network, a list containing all the configuration data is generated. The configuration list is then compiled into an ocean script for simulation.

While computer-aid design (CAD) tools for FPGAs have been extensively developed. There are no general methodologies or CAD tools developed for FPAA fabrics. The tools used for FPAAs are typically customized to cater to specific CAB topology, array architecture and targeted application. A design flow is proposed to rapidly generate programming keys for all the CABs within the array. The proposed flow is shown in FIG. 7. The synthesis and configuration of the FPAA is divided into three steps: programming the CAB, programming the CAB biases, and programming the global feedback network. For the configuration of all the CABs within the array, since the CABs are implemented in a matrix format, each CAB is labeled with row-major order, with the configuration of the FPAA stored through a python script. The bias condition for each CAB is determined next. Finally the configuration of global feedback network is performed and a configuration list for all the elements within the FPAA is generated. The configuration list is compiled into an ocean script that is directly used for SPICE simulation.

1.5.2. FPAA Programming Procedure

The mapping of an analog circuit onto the FPAA fabric is divided into two steps: placement and routing. The placement step maps the lowest-level analog sub-blocks into different CABs while the routing procedure activates switches within and between CABs. In the proposed FPAA fabric, switchless interconnects are used as the forward signal path, while the routing switches between CABs are components of the feedback network. The matrix architecture allows the user to access CABs in each column directly. The location of the output port is also flexible and is set according to the location of the inputs. The general synthesis strategy is presented as FIG. 14, Algorithm 1. Starting with the placement procedure, the analog sub-circuits are first mapped into different CABs. The general activation and selection of each CAB can follow the device placement of the baseline design. With the utilization of several pre-defined configurations of the CABs, the users are able to rapidly implement desired analog circuits with single or multiple CABs.

1.6 VI. Uses of the Multi-Cab Array

This section describes the multi-cab system used to implement a second order biquad filter, a differential mode ring oscillator, and a frequency divider (quadrature phase generator).

1.6.1. Second Order Biquad Filter

Figure 8:
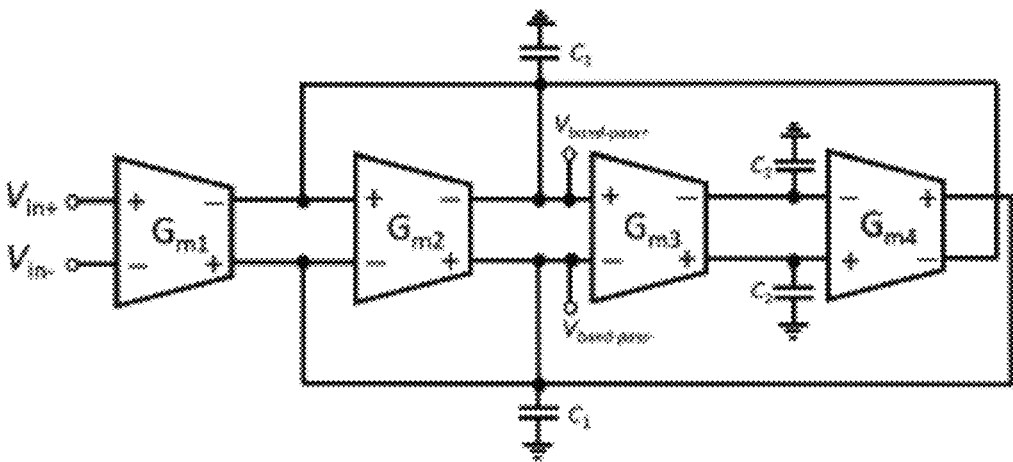
FIG. 8 shows a schematic of a second-order biquad filter. Each Gm cell includes one or multiple CABs from one column of the CABs matrix. The negative feedback for Gm2 is set by the feedback switches within the CAB. The positive feedback between Gm3 and Gm4 is achieved through the global feedback network.
Figure 9:
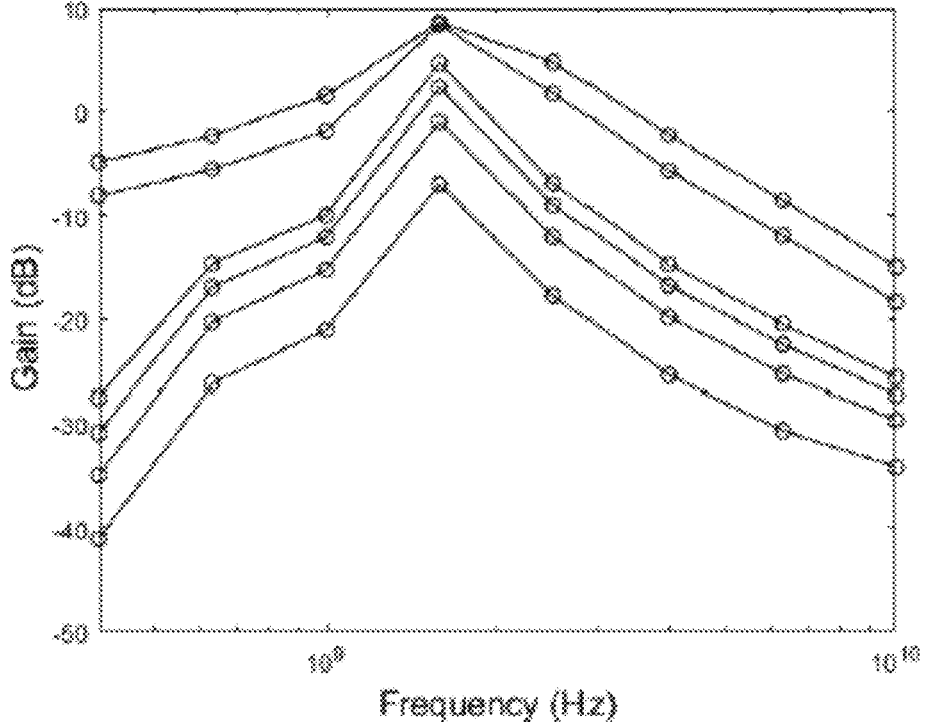
FIG. 9 shows simulation of the second-order biquad filter, where the bandwidth and peak gain are tuned by adjusting Gm1 and Gm2.

A biquad filter is a type of Gm-C filter that is found in a large number of RF and mixed-signal systems due to the tunability and robust structure provided. The FPAA is reconfigured into a second order biquad filter to test the performance of multi-CAB system. The schematic of the second order biquad filter is shown in FIG. 8, which includes four Gm cells. To provide tunable Gm, the number of CABs activated in a given column varies to achieve a variable transconductance. To maintain the stability of the DC operating points, the CAB1$s$ are reconfigured into a single stage op amp with resistive common-mode feedback. Since each Gm cell consumes one column of the CAB matrix, a second order biquad filter requires four columns of CAB1$s$ in total. The connection between the CABs is achieved by using switch-less routing interconnects to minimize the effects on the bandwidth while the negative feedback path for Gm2 is established through embedded routing switches (S2 and S4 in FIG. 4$a$) within the CAB. The positive feedback path from Gm4 to Gm2 is established through the global feedback network. The band pass transfer function of a second-order biquad filter is given by:

$$\frac{Vout}{Vin} = gm1\left(\frac{C2}{C1}\right)S \Big/ \left(S^2 + \left(\frac{gm2}{C1}\right)S + \frac{gm3gm4}{C1C2}\right) \qquad \text{EQ. 1}$$

$$K * \frac{wo}{Q} * S \Big/ \left(S^2 + \frac{wo}{Q} * S + w_0^2\right) \qquad \text{EQ. 2}$$

$$K = \frac{gm1}{gm2}, \frac{w0}{Q} = \frac{gm2}{C1}, w_0^2 = \frac{gm3 * gm4}{C1 * C2} \qquad \text{EQ. 3}$$

Where K represents the peak gain, !0 the center frequency, and w0/Q the bandwidth. In this example, the peak gain tuned at the at center frequency by adjusting the value of Gm2. The results of the simulation of the second-order biquad filter is shown in FIG. 9, with minimum a peak gain of −9 dB and a maximum peak gain of 8 dB.

1.6.2. Ring Oscillator

A ring oscillator is a component of phase-locked loops (PLL) and data recovery circuits of serial data communication systems. While single-ended inverter-based ring oscillators are easily generated in the digital domain, the differential mode CABs allow for the configuration of differential ring oscillators. First, the desired number of CABs from a specific row of the CAB matrix is selected based on the target frequency specification, while unused CABs of the other rows are deactivated. The selected individual CABs are programmed into single stage op amps with diode connected PMOS loads.

Diode-connected loads are chosen due to superior linearity provided as compared to resistive loads. As the switch-less routing strategy between CABs is utilized, no routing switches are needed for the forward propagation of the signal. However, a path to back propagate the generated signal is needed, which results in a close loop negative feedback for the ring oscillator. Therefore, the global routing network is utilized to form the feedback path across multiple CABs. An advantage of using a differential mode ring oscillator is that the use of an even number of stages is permitted, while an inverter-based ring oscillator only allows an odd number of stages. Therefore, the proposed FPAA topology permits 3 to 6 stages in a six column CAB floorplan.

Figure 11:
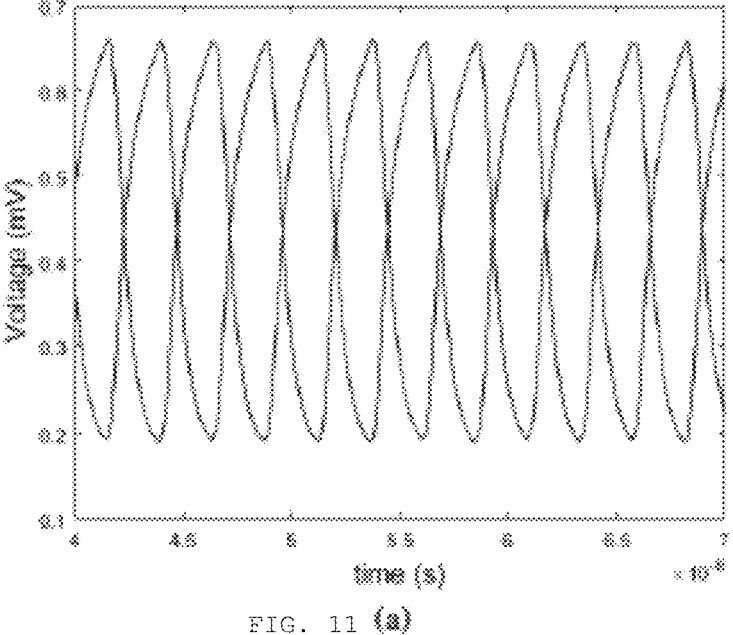
FIGS. 11(a) and 11(b) shows simulation of a differential ring oscillator to characterize the 11(a) transient response of six-stages, which oscillates at a frequency of 328 MHz, and 11(b) oscillating frequency based on the number of stages, which are programmed to be from three to six.
Figure 11:
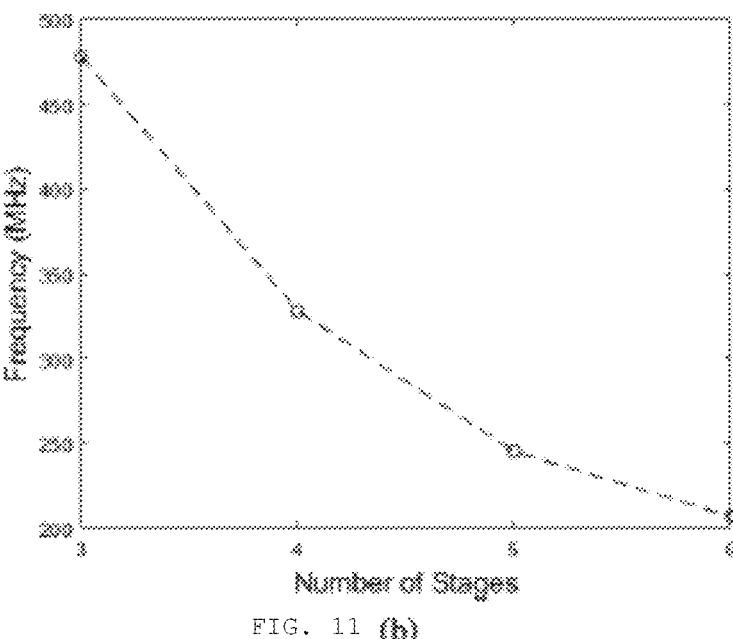

The transient simulation of the FPAA reconfigured as a six-stage ring oscillator is given in FIG. 11($a$). The oscillating frequency as a function of the number of stages is plotted in FIG. 11($b$), where a maximum frequency of 478 MHz is generated with three stages and a minimum frequency of 207 MHz is generated with six stages.

1.6.3 Frequency Divider

Figure 12:
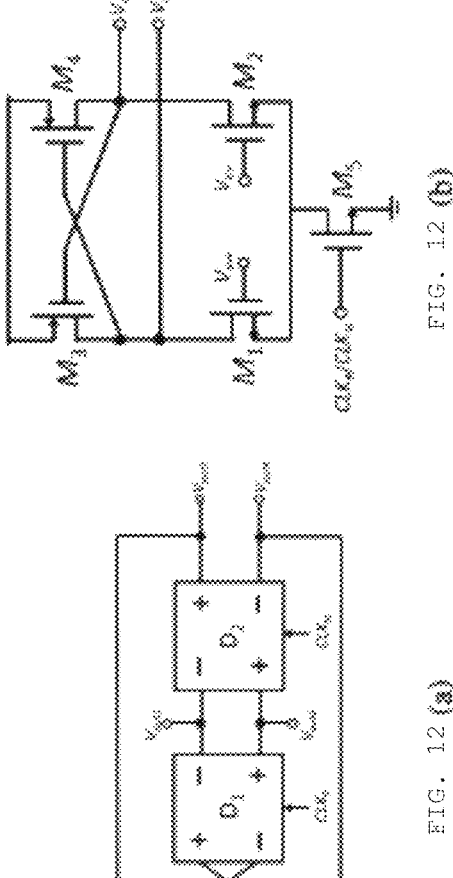
FIGS. 12(a) and 12(b) shows a schematic of frequency divider.
Figure 13:
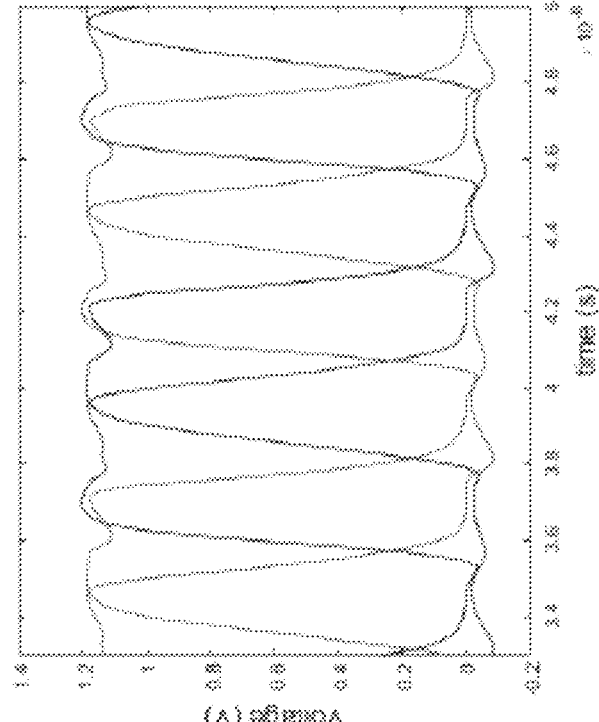
FIG. 13 shows a transient simulation of a divide-by-2 frequency divider with a 200 MHz input frequency. The four outputted signals are 90 degree phase shifted. All four signals are full swing (1.2 V).

The differential mode divide-by-2 frequency divider is widely used in mixed-signal and RF circuits including analog to digital converter (ADC), clock generation, and quadrature amplitude modulators (QAM). A typical divider is implemented from two differential dynamic latch as shown in FIG. 12. The proposed FPAA supports the implementation of a frequency divider by first configuring two differential mode CABs (CAB1) from two adjacent column. Each CAB is programmed to generate a differential dynamic latch, where the PMOS transistor pair forms a regeneration loop while the input NMOS pair maintains separate input ports. In addition, the positive feedback path across two CABs is established through the global feedback network. Notice that each dynamic latch requires a clock signal with a 180-degree phase shift as input to the gate of transistor M5. An additional signal path is added to support such a requirement. Therefore, the gate of M5 is either connected to a DC bias or an input signal terminal. The transient simulation of the divide-by-2 frequency divider is shown in FIG. 13, a 200 MHz signal results in four 100 MHz signals phase shifted by 90 degrees.

1.7 Comparison to Prior FPAA

FIG. 17, Table III compares the performance of the proposed FPAA with prior work.

The most important metrics to evaluate a FPAA are bandwidth, circuit variability and area. More variability usually requires additional routing switches, which results in a smaller bandwidth due to parasitic impedance of the routing network. A trade-off between the bandwidth and variability is handled by implementing a hybrid routing technique, where both switch-based and switch-less connections are utilized.

Routing switches between CABs are avoided, while increasing the variability of individual CABs by considering each differential NMOS or PMOS pair as a programmable unit.

The proposed fully programmable CAB provides significant configuration as well as built-in positive or negative feedback paths. The area of each CAB is also more compact as compared to a floating gate based CAB, where massive interconnect switches are needed.

Embodiments

The following descriptions provide further detail regarding the embodiments, with reference to the figures.

1. A field programmable analog array (FPAA) comprising at least one configurable analog block (CAB) that is fully programmable with no prior functionality before programming. The FPAA fabric is utilized to implement various analog circuits.

2. The FPAA of embodiment 1, wherein routing switches between different CABs are eliminated to address the bandwidth limitation of the overall system. The operating frequency of the FPAA is improved up to 1.5 GHz.

3. The FPAA of embodiment 1, wherein the FPAA is used to implement an op amp, continuous-time filter, ring-oscillator, and frequency divider.

4. The FPAA of claim 1, wherein the CAB is organized in a 6×6 CAB matrix architecture (or user defined). The first 5 rows of the CABs are utilized to implement differential mode analog systems while the last row of CABs is used to implement the analog circuit in single-ended mode.

5. The FPAA of embodiment 4, wherein the CAB supports differential mode operation or single-ended mode operation.

Figure 4:
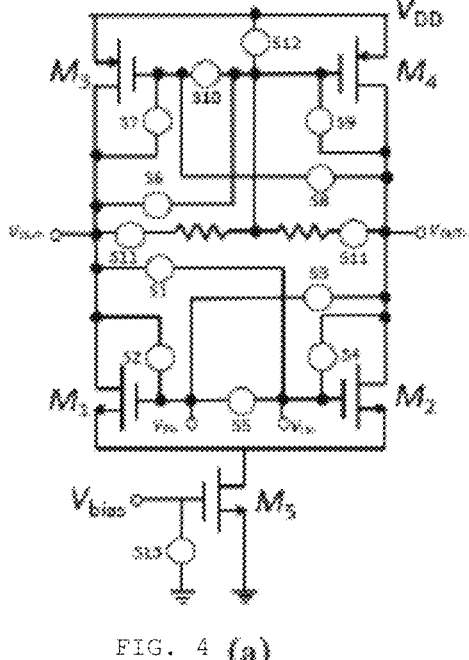
FIGS. 4(a) and 4(b) show schematics of 4(a) a differential mode CAB (CAB1), and 4(b) a single ended mode CAB (CAB2) where CAB1 includes 13 routing switches, in addition to four possible configuration of the transistor pair. S11 is added to provide common-mode feedback and S12 and S13 are used to completely turn off CAB1. CAB2 includes 18 routing switches. S11 to S14 are used to isolate the global switch-less interconnects and the gates of transistors M1 to M4. S15 to S18 are used to turn off the CAB.
Figure 4:
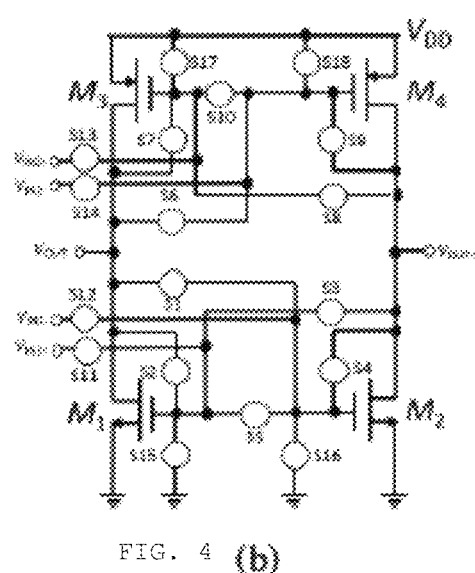

6. The FPAA of embodiment 5, wherein the differential mode operation is accomplished using the architecture as shown in FIG. 4(*a*), which includes one NMOS differential pair, one PMOS differential pair, and one NMOS current source. The switches S1 to S5 are used to program the NMOS differential pair. The switches S6 to S10 are used to program the PMOS differential pair. The S11 switch controls the common mode feedback, while S12 and S13 completely turn off the CAB by connecting the gate of the PMOS current source to VDD and the gate of the NMOS current source to ground.

7. The FPAA of embodiment 4, wherein the 6×6 CAB matrix is organized as shown in FIG. 1, which consists of five rows of differential mode CABs (CAB1) and one row of single-ended mode CABs (CAB2). The connection between the CABs is implemented as a fixed interconnect, where no routing switch is being used, which provides an improved operating frequency of the FPAA system. The global feedback network provides a feedback path across multiple columns.

8. The FPAA of embodiment 2, wherein five routing switches and two NMOS/PMOS transistors are utilized to implement a reconfigurable transistor pair as shown in FIGS. 3(*a*) and (*b*). The routing switches S1 to S5 and S6 to S10 are added as controllable interconnects between the gate and drain terminals. Therefore, the routing switches have no impact on the DC operating points of the analog circuit and require no additional calibration. The programmable transistor pair is reconfigured into topologies including a current mirror, a regeneration loop, a current source pair, and a diode-connected pair as shown in FIGS. 2(*a*)-(*d*).

9. A global feedback network design as shown in FIG. 5. The global feedback network includes two parallel paths to support differential mode operation. The input and output terminals of the CABs in each column are tied together using single global interconnects. To explicitly define the polarity of the differential signals applied to the CABs, the switch-less networks are labeled to differentiate between the positive path, p-path (c #p), and the negative path, n-path (c #n). The positive terminal of each CAB is directly connected to the p-path only, and the negative terminal of each CAB is routed to the n-path only. Since the switch-less interconnects include an explicitly annotated polarity, negative feedback is provided by connecting a positively labeled output with a negatively labeled input and a negatively labeled output with a positively labeled input. Similarly, positive feedback is achieved by connecting inputs and outputs with the same polarity.

10. The FPAA of embodiment 6, a synthesis strategy to efficiently program the developed FPAA architecture. The synthesis flow is presented in FIG. 7. The synthesis and configuration of the FPAA is divided into three steps: programming the CAB(s), programming the CAB biases, and programming the global feedback network. For the configuration of all the CABs within the array, since the CABs are implemented in a matrix format, each CAB is labeled in row-major order, with the configuration of the FPAA stored through a python script. Starting with the placement procedure, the analog sub-circuits are first mapped into different CABs. With the utilization of several predefined configurations of the CABs, users can rapidly implement desired analog circuits with single or multiple CABs. The programming bit stream is compiled into an ocean script for SPICE simulation.

11. A second-order biquad filter design as shown in FIG. 8 using the FPAA comprised of the following logic. The CAB1 in the FPAA is reconfigured into a single-stage op amp with resistive common-mode feedback. Since each Gm cell occupies one column of the CAB matrix, a second-order biquad filter requires four columns of CAB1*s* in total. The connection between each column of the CAB is achieved through switch-less interconnect, which provides more bandwidth to the filter. The negative feedback path for Gm2 is established through routing switches (S2 and S4 in FIG. 4*a*) that are embedded within the CAB. The global feedback network establishes the positive feedback path from Gm4 to Gm2.

Figure 10:
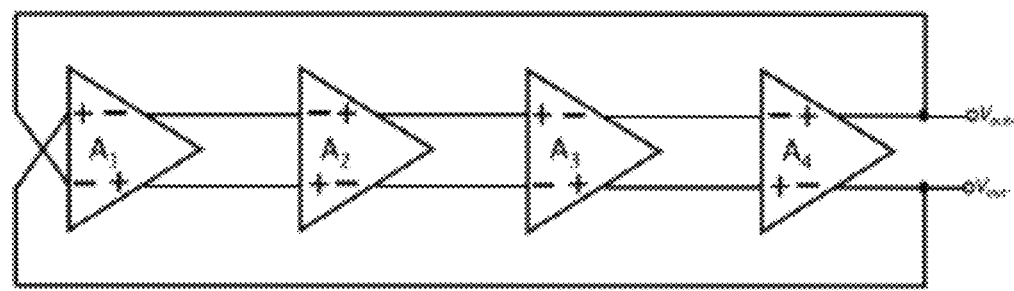
FIG. 10 shows a schematic of a four-stage ring oscillator. An even number of stages is possible due to the utilization of differential mode signal.

12. A ring oscillator design as shown in FIG. 10 using the FPAA comprised of the following logic. First, the desired number of CABs from a specific row of the CAB matrix is selected based on the target frequency specification, while unused CABs of the other rows are deactivated. The selected individual CABs are programmed into single-stage op amps with diode-connected PMOS loads. The global routing network is utilized to form the feedback path across multiple CABs. Due to the differential mode implementation, the proposed FPAA topology allows for the implementation of 3 to 6 stages in a six-column CAB floorplan.

13. A frequency divider design as shown in FIG. 12(*a*) using the FPAA comprised of the following logic. First, two differential mode CABs (CAB1) from two adjacent columns are selected. The PMOS transistor pair of the selected CAB is reconfigured into a regeneration loop while the NMOS transistor pair maintains separate input ports. The positive feedback path is achieved through the global feedback network.

1.8. Conclusion

The 6×6 CAB matrix proposed herein was developed in a 65 nm CMOS technology. The multi-CAB topology supports analog signal filtering, frequency division, and clock signal generation.

The proposed architecture integrates both switch-less and switch-based routing to both increase the reconfigurability of FPAA and minimize the effect on the bandwidth. The CABs are designed to be fully programmable while occupying a minimum area. Feedback paths are formed by routing switches within individual CAB or between multiple CABs using the global feedback network. A synthesis methodology is also described to aid the implementation of CAB-based analog circuits.

The FPAA core includes 36 CABs, 14 switch-less interconnects, 498 programming switches and occupies 0.1 mm2 area. For a reconfigured bandpass filter, the tunable range of the peak gain is from −10 dB to 8 dB. For the implemented ring-oscillator, the operating frequency is between 207 MHz and 478 MHz, with maximum swing of 0.45 Vpeak-to-peak. The reconfigured divider supports frequency division of a signal of up to 200 MHz bandwidth.

While the invention has been described with reference to the embodiments above, a person of ordinary skill in the art would understand that various changes or modifications may be made thereto without departing from the scope of the embodiments.

The invention claimed is:

1. A field programmable analog array (FPAA) comprising at least one configurable analog block (CAB) that is fully programmable with no prior functionality before programming, wherein the FPAA is configured to implement various analog circuits;

wherein the CAB is organized as a matrix architecture;

wherein a connection between rows in the matrix architecture is a fixed interconnect, wherein no routing switch is being used;

wherein the fixed interconnect provides an improved operating frequency of the FPAA system.

2. The FPAA of claim 1, wherein routing switches between different CABs are eliminated to address the bandwidth limitation of the overall system, resulting in an operating frequency of the FPAA that improves by up to 1.5 GHZ.

3. The FPAA of claim 1, wherein the FPAA is used to implement an op amp.

4. The FPAA of claim 1, wherein the FPAA is used to implement a continuous-time filter.

5. The FPAA of claim 4, wherein the CAB supports differential mode operation or single-ended operation.

6. The FPAA of claim 1, wherein the FPAA is used to implement a ring-oscillator.

7. The FPAA of claim 1, wherein the FPAA is used to implement a frequency divider.

8. The FPAA of claim 1, wherein the CAB is organized in a 6×6 CAB matrix architecture.

9. The FPAA of claim 8, wherein a first 5 rows of the CAB matrix implement differential mode analog systems while a last row of the CAB matrix implements an analog circuit in single-ended mode.

10. The FPAA of claim 8, wherein the CAB matrix supports differential mode operation or single-ended mode operation.

11. The FPAA of claim 10, wherein the differential mode operation is accomplished using the architecture that comprises one NMOS differential pair, one PMOS differential pair, and one NMOS current source.

12. The FPAA of claim 11, wherein the architecture further comprises switches S1 to S5 used to program the NMOS differential pair.

13. The FPAA of claim 12, wherein switches S6 to S10 program the PMOS differential pair.

14. The FPAA of claim 13, wherein an S11 switch controls a common mode feedback.

15. The FPAA of claim 14, wherein switches S12 and S13 turn off the CAB by connecting a gate of the PMOS current source to VDD and a gate of the NMOS current source to ground.

16. The FPAA of claim 8, wherein 6×6 CAB matrix architecture comprises five rows of differential mode CABs (CAB1) and one row of single-ended mode CABs (CAB2).

17. The FPAA of claim 1, wherein a global feedback network provides a feedback path across multiple columns.

18. The FPAA of claim 1, wherein the CAB matrix is organized in a user-defined matrix architecture.

* * * * *